United States Patent [19]
Yamada et al.

[11] Patent Number: 5,128,618
[45] Date of Patent: Jul. 7, 1992

[54] WITHSTAND-VOLTAGE TESTING METHOD AND APPARATUS

[75] Inventors: Yoshiharu Yamada, Shiga; Shigeru Suzuki, Yokkaichi; Shoji Yamamoto, Mie, all of Japan

[73] Assignee: Sumitomo Wiring Systems Ltd., Mie, Japan

[21] Appl. No.: 647,970

[22] Filed: Jan. 30, 1991

[30] Foreign Application Priority Data

Feb. 5, 1990 [JP] Japan .................................. 2-26573

[51] Int. Cl.⁵ ............................................ G01R 31/00
[52] U.S. Cl. .................................. 324/501; 324/542; 324/536
[58] Field of Search ................. 340/650, 691; 250/554, 250/227.21, 227.23; 324/122, 102, 501, 536, 542, 541

[56] References Cited

U.S. PATENT DOCUMENTS

| | | |
|---|---|---|
| 3,135,915 | 6/1964 | Odok. |
| 3,421,076 | 1/1969 | Eigen .................................. 324/536 |
| 3,899,735 | 8/1975 | Singer .................................. 324/122 |
| 3,991,367 | 11/1976 | Chapman ........................... 324/122 |

FOREIGN PATENT DOCUMENTS

| | | |
|---|---|---|
| 559270 | 9/1932 | Fed. Rep. of Germany. |
| 928784 | 6/1955 | Fed. Rep. of Germany. |
| 2851537 | 6/1980 | Fed. Rep. of Germany. |
| 3031517 | 7/1980 | Fed. Rep. of Germany. |
| 2388279 | 12/1978 | France .................................. 324/501 |
| 0158278 | 12/1979 | Japan .................................. 324/501 |

Primary Examiner—Kenneth A. Wieder
Assistant Examiner—Jose M. Solis
Attorney, Agent, or Firm—Sughrue, Mion, Zinn, Macpeak & Seas

[57] ABSTRACT

A method of and an apparatus for testing a withstand-voltage of a work having a core conductor coated for insulation with an insulating member, the method comprising the steps of: enclosing the insulating member by a grounded conductor; providing first and second discharge electrodes for the core conductor and the grounded conductor, respectively so as to connect the first and second discharge electrodes between the core conductor and the grounded conductor; applying high-voltage pulses to the core conductor so as to detect discharge beams generated in a gap between the first and second discharge electrodes; and judging whether or not the insulating member has a proper withstand-voltage.

4 Claims, 2 Drawing Sheets

WITHSTAND-VOLTAGE TESTING METHOD AND APPARATUS

BACKGROUND OF THE INVENTION

1. Field of the Invention

The present invention relates to a method of testing a withstand-voltage of a device utilizing a core conductor coated for insulation and a withstand-voltage testing apparatus employed in this method.

2. Description of the Related Art

FIGS. 1 to 3 show a conventional high withstand-voltage testing apparatus for testing a high withstand-voltage of a device 1 in which a core conductor 2 is coated with an insulating member 3 made of resin, or the like. For the test, the device 1 is enclosed by a grounded conductor 4. A three-pole discharge electrode 5 is constituted by a positive pole 5a, a negative pole 5b and a floating pole 5c. The positive pole 5a is connected to the core conductor 2, while the negative pole 5b is connected to the grounded conductor 4. A high-voltage pulse generator 6 is constituted by a high-voltage generator 6a and an oscillator 6b. A resistor R for detecting leakage current of the device 1 is inserted between the grounded conductor 4 and earth. A voltmeter 7 is provided for detecting voltage of the resistor R.

As shown in FIG. 3, in the case where a high-voltage cable 9 coupled with a spark plug 8 for automobiles is employed as the device 1, a resinous coating 10 of the high-voltage cable 9 has joints and pin holes. Thus, a high withstand-voltage test is performed mainly at coupling portions 10a and 10b of the high-voltage cable 9, where leakage current is likely to be produced. Accordingly, a distal end 8' of the high-voltage cable 9 adjacent to the spark plug 8 is supported by a coupling jig 11c.

Meanwhile, after a conductor 12 extending from the coupling portion 10a has been positively insulated by resin 13, or the like, the coupling portions 10a and 10b are supported by grounding jigs 11a and 11b, respectively and further are, respectively, surrounded by metallic beads 4a and 4b strung on threads and acting as the grounded conductor 4 so as to be grounded.

In the above described arrangement of the known high withstand-voltage testing apparatus, high-voltage pulses are applied to the core conductor 2 and the positive pole 5a of the discharge electrode 5 as shown in FIG. 1. When there is no leakage current in the work 1, pulsed discharge beams are continuously generated in a gap of the discharge electrode 5. On the contrary, when there is leakage current in the device 1, discharge does not take place at the discharge electrode 5 and electric current flows through the resistor R. In this case, by reading voltage of the voltmeter 7, it is determined that the work 1 has an improper withstand-voltage. It is to be noted that the voltmeter 7 may be replaced by a neon lamp, or other voltage indicating device.

In the conventional high withstand-voltage testing apparatus referred to above, leakage current in the work 1 is detected by the resistor R or the neon lamp. The resistor R or the neon lamp is an electric detector and therefore, is affected by electrical noises. Accordingly, if electrical noises become extremely large, it is necessary to raise the impedance between the detection system and the decision system. As a result, the decision system is susceptible to electrical noises and thus, functions unstably.

For example, in the conventional apparatus, even in the case where the device 1 has proper withstand-voltage and discharge is generated at the discharge electrode 5, leakage current due to moisture, etc. is detected at the device 1, thereby resulting in an erroneous determination in the high withstand-voltage test. Furthermore, such high withstand-voltage testing apparatus is disadvantageous in that an erroneous determination is likely to be made due to long response time from detection to decision or drop of detection sensitivity.

SUMMARY OF THE INVENTION

Accordingly, an essential object of the present invention is to provide a method of, and an apparatus for, testing a withstand-voltage of a work device having a core conductor coated for insulation, which eliminates the above-mentioned disadvantages inherent in conventional methods and apparatuses of this kind.

In order to accomplish this object of the present invention, a method of testing a withstand-voltage of a work having a core conductor coated with an insulating member, according to the present invention includes the steps of, enclosing the insulating member by a grounded conductor, providing first and second discharge electrodes for the core conductor and the grounded electrode, respectively so as to connect the first and second discharge electrodes between the core conductor and the grounded conductor, applying high-voltage pulses to the core conductor so as to detect discharge beams generated in a gap between the first and second discharge electrodes; and judging whether or not the insulating member has a proper withstand-voltage.

Furthermore, an apparatus for testing a withstand-voltage of a device having a core conductor coated for insulation with an insulating member which is enclosed by a grounded conductor, according to the present invention has: a pair of discharge electrodes which are connected between the core conductor and the grounded conductor, a high-voltage pulse generator for applying high-voltage pulses to the discharge electrodes, a light receiving portion for detecting pulsed discharge beams generated between the discharge electrodes, and a decision portion which detects, based on an output of the light receiving portion, presence or absence of the pulsed discharge beams synchronous with the high-voltage pulses so as to judge whether or not the device has a proper dielectric strength.

In accordance with the present invention, generation of leakage current of the device is detected by directly detecting presence or absence of the pulsed discharge beams generated at the gap of the discharge electrodes, accordingly it is possible to judge whether or not the work has proper dielectric strength.

BRIEF DESCRIPTION OF THE DRAWINGS

This object and features of the present invention will become apparent from the following description taken in conjunction with the preferred embodiment thereof with reference to the drawings, in which.

Before the description of the present invention proceeds, it is to be noted that like parts are designated by like reference numerals throughout the accompanying drawings.

DETAILED DESCRIPTION OF THE INVENTION

Figure 4:
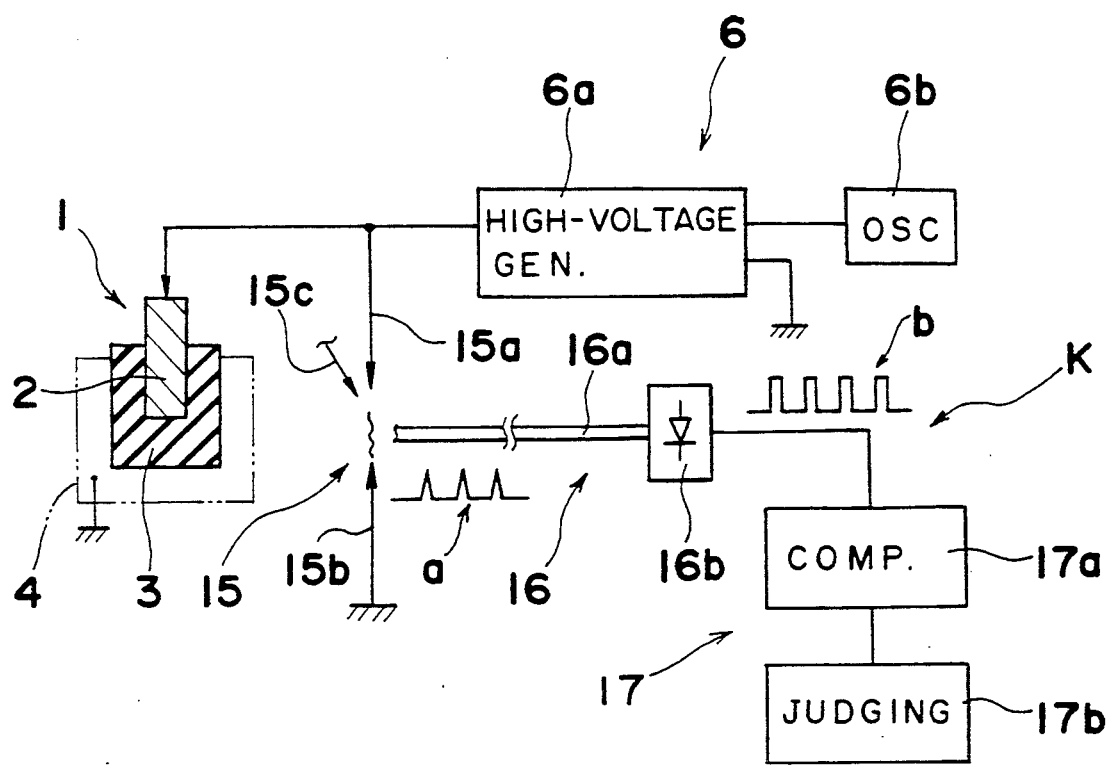
FIG. 4 is a block diagram of a withstand-voltage testing apparatus according to one embodiment of the present invention.

Below, a withstand-voltage testing method and a withstand-voltage testing apparatus K employed in this method, according to a first embodiment of the present invention are described with reference to FIG. 4.

Figure 1:
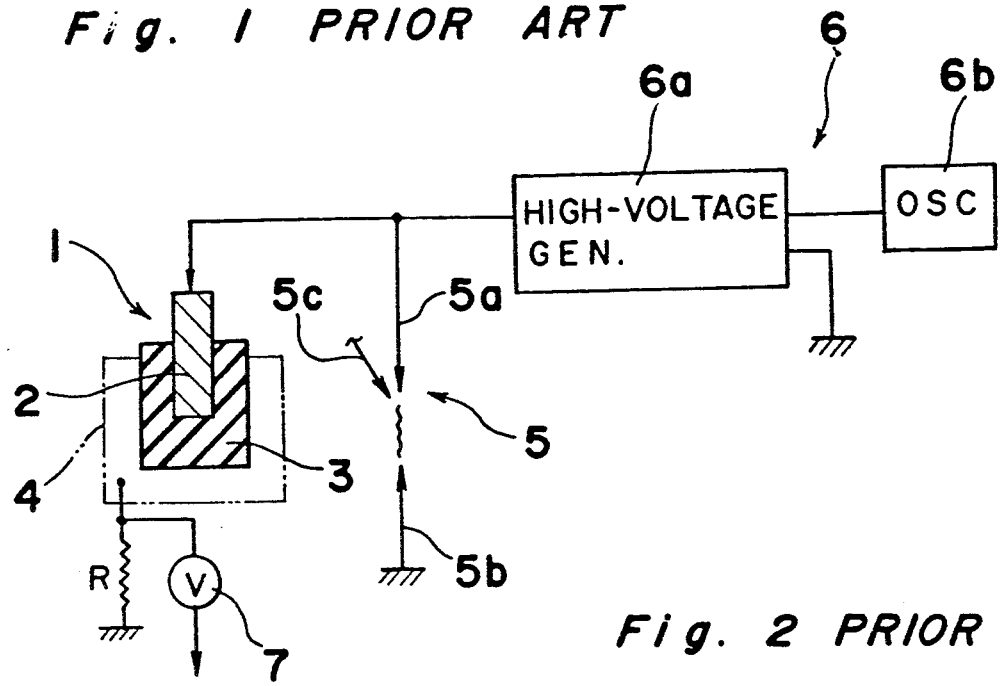
FIG. 1 is a block diagram of a prior art withstand-voltage testing apparatus (already referred to)
Figure 2:
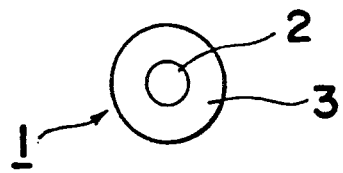
FIG. 2 is a top plan view of a work employed in the prior art withstand-voltage testing apparatus of FIG. 1 (already referred to)
Figure 3:
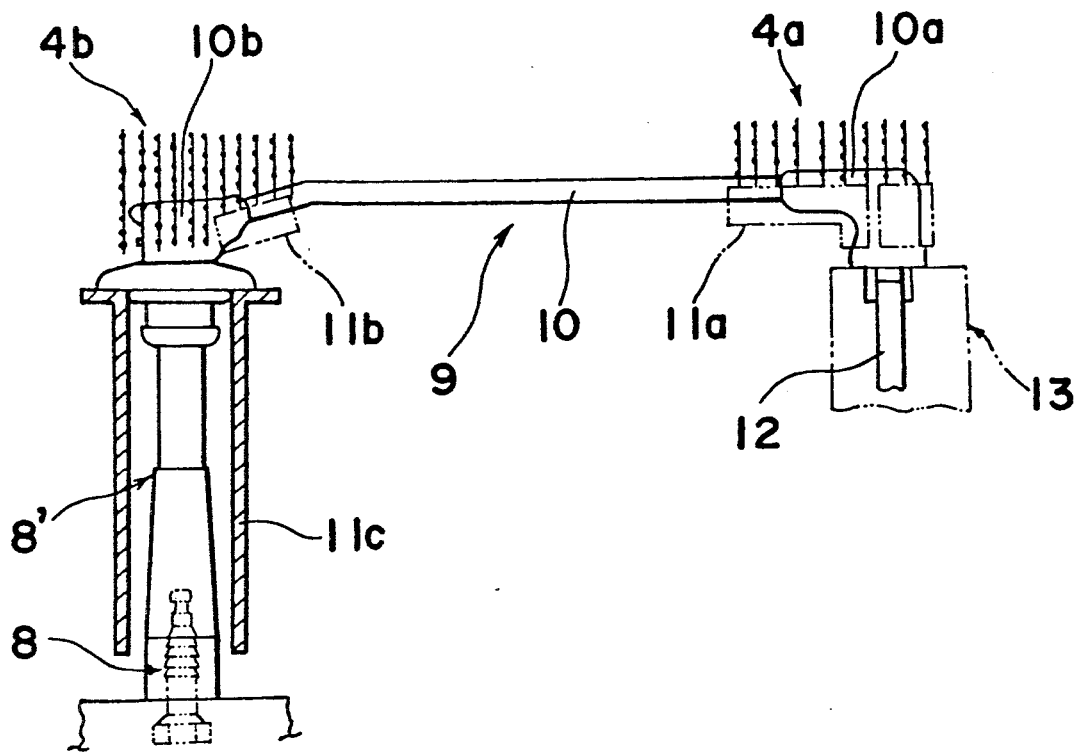
FIG. 3 is a fragmentary side elevational view of a high-voltage cable of a spark plug for automobiles, which is employed as the work of FIG. 2 (already referred to)

In the same manner as in the prior art apparatus of FIGS. 1 to 3, a device 1 has a core conductor 2 which is coated with an insulating member 3 made of resin, or the like. For the test, the device 1 is enclosed by a grounded conductor 4. A high-voltage pulse generator 6 is constituted by a high-voltage generator 6a and an oscillator 6b.

However, in the apparatus K, the discharge electrode 5 of the prior art apparatus is replaced by a discharge electrode 15 constituted by a positive pole 15a, a negative pole 15b and a floating pole 15c. The positive pole 15a is connected to the core conductor 2, while the negative pole 15b is connected to the grounded conductor 4. The apparatus K further includes a light receiving portion 16 and a decision portion 17. In order to detect leakage current of the device 1 in the apparatus K, an optical detecting system including the discharge electrode 15, the light receiving portion 16 and the decision portion 17 is employed in place of the prior art electric detecting system (FIGS. 1 and 2) which utilized the resistor R, the voltmeter 7, etc.

The light receiving portion 16 includes an optical fiber 16a drawn from vicinity of a gap of the discharge electrode 15 and a high-speed photo diode 16b. The photo diode 16b is connected to an output of the optical fiber 16a so as to generate a reverse voltage upon reception of light.

Meanwhile, the decision portion 17 includes a synchronous comparator 17a and a judging portion 17b. The synchronous comparator 17a is connected to an output of the photo diode 16b so as to synchronously compare high-voltage pulses applied to the discharge electrode 15 and pulsed discharge beams at the discharge electrode 15. The judging portion 17b is connected to an output of the synchronous comparator 17a and detects presence or absence of leakage current in the work 1 by detecting presence or absence of the pulsed discharge beams synchronous with the high-voltage pulses so as to judge whether or not the device 1 has proper withstand-voltage.

Operation of the method and the apparatus K of the present invention will now be described. In the method of the present invention, high-voltage pulses are initially applied to the core conductor 2 of the device 1 and the positive pole 15a of the discharge electrode 15. Then, if there is no leakage current in the insulating member 3 pulsed discharge beams are continuously generated in a gap of the discharge electrode 15 synchronously with the high-voltage pulses. On the other hand, if there is leakage current in the insulating member 3, a large quantity of electric current flows through the device 1 and thus, the pulsed discharge beams disappear from the gap of the discharge electrode 15. Thus, presence or absence of the pulsed discharge beams generated in the gap of the discharge electrode 15 is detected synchronously with the high-voltage pulses so as to detect presence or absence of leakage current of the work 1 such that a decision is made as to whether or not the device 1 has proper withstand-voltage.

When the withstand-voltage testing method of the present invention is carried out, high-voltage pulses of 50–100 Hz and about 25 KV are initially generated by the high-voltage pulse generator 6 so as to produce pulsed discharge beams in the gap of the discharge electrode 15. Then, only pulse beams a of the discharge beams are received by the optical fiber 16a so as to be electrically converted into pulse waves b by the photo diode 16b such that the pulse waves b are outputted from the light receiving portion 16. Subsequently, the pulse waves b are detected synchronously with the high-voltage pulses by the decision portion 17. If there is no leakage current in the device 1, the pulse waves b are continuously generated. Thus, in this case, the decision portion 17 judges that the device has proper withstand-voltage. On the other hand, if there is leakage current in the device 1, a large quantity of electric current flows through the device 1 at the moment and thus, the pulse waves b disappear. Therefore, when the pulse waves b disappear for one period of the pulse waves b, the decision portion 17 is capable of judging that the device 1 has improper withstand-voltage. Accordingly, the decision portion 17 a high decision accuracy. For decision accuracy in practical use, the decision portion 17 is required to judge that the device 1 has improper withstand-voltage when two or more of the pulse waves b have disappeared continuously. Meanwhile, the light receiving portion 16 desirably includes the high-speed photo diode 16b. However, the high-speed photo diode 16b may be replaced by a photo detector having a short response time.

As is clear from the foregoing description, when a withstand-voltage of a high-voltage cable having a conductor coated for insulation is tested in the present invention, the discharge beams generated at the discharge electrode are directly detected such that leakage current is detected based on presence or absence of generation of the discharge beams, whereby it is judged whether or not the high-voltage cable has proper withstand-voltage. Therefore, in accordance with the present invention, the electrically independent optical system detects leakage current of the device and therefore, is not affected by electrical noises, thus, resulting in improvement of decision accuracy of the withstand-voltage test.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of testing a withstand-voltage of a device having a core conductor coated for insulation with an insulating member, comprising the steps of:
    enclosing the insulating member by a grounded conductor;

providing first and second discharge electrodes that are electrically connected to the core conductor and the grounded conductor, respectively;

applying high-voltage pulses at a predetermined frequency to the core conductor and visually detecting discharge beams generated in a gap between said first and second discharge electrodes; and judging whether or not the insulating member has a proper withstand-voltage based upon whether or not said discharge beams are generated at said predetermined frequency.

2. An apparatus for testing a withstand-voltage of a device having a core conductor coated for insulation with an insulating member which is enclosed by a grounded conductor, the apparatus comprising:

first and second discharge electrodes which are connected to the core conductor and the grounded conductor respectively;

a high-voltage pulse generator for applying high-voltage pulses at a predetermined frequency to said discharge electrodes;

a light receiving portion for detecting pulsed discharge beams generated between said discharge electrodes; and a decision portion which detects, from an output of the light receiving portion, presence or absence of the pulsed discharge beams synchronous with said predetermined frequency of said high-voltage pulses so as to judge whether or not the work insulating member has proper dielectric strength.

3. An apparatus as claimed in claim 2, wherein said light receiving portion includes an optical fiber and a high-speed photo diode.

4. An apparatus as claimed in claim 2, wherein said decision portion includes a synchronous comparator and a judging portion.

* * * * *